United States Patent
Tai (10) Patent No.: US 11,735,583 B2
(45) Date of Patent: Aug. 22, 2023

(54) INTEGRATED ISOLATOR INCORPORATING TRENCH CAPACITOR

(71) Applicant: NXP B.V., Eindhoven (NL)

(72) Inventor: Han-Chung Tai, Hsinchu (TW)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 17/467,564

(22) Filed: Sep. 7, 2021

(65) Prior Publication Data

US 2023/0070868 A1 Mar. 9, 2023

(51) Int. Cl.
| | |
|---|---|
| *H01L 23/522* | (2006.01) |
| *H01L 27/06* | (2006.01) |
| *H01L 25/065* | (2023.01) |
| *H01L 21/768* | (2006.01) |
| *H01L 21/762* | (2006.01) |
| *H01L 23/00* | (2006.01) |

(52) U.S. Cl.
CPC .... *H01L 27/0629* (2013.01); *H01L 21/76885* (2013.01); *H01L 23/5223* (2013.01); *H01L 25/0655* (2013.01); *H01L 21/76224* (2013.01); *H01L 24/48* (2013.01); *H01L 2224/48137* (2013.01)

(58) Field of Classification Search
CPC . H01L 23/522–53295; H01L 29/66181; H01L 29/407; H01L 28/90–92; H01L 29/945; H01L 2224/48; H01L 2224/481; H01L 2224/48137; H01L 2924/1205
See application file for complete search history.

(56) References Cited

U.S. PATENT DOCUMENTS

| | | | |
|---|---|---|---|
| 2016/0163692 A1 | 6/2016 | Moghe et al. | |
| 2018/0190646 A1 | 7/2018 | Palumbo et al. | |
| 2021/0036100 A1* | 2/2021 | Lu | H01G 4/306 |
| 2022/0014095 A1* | 1/2022 | Dabral | H02M 3/07 |
| 2022/0028825 A1* | 1/2022 | Jeng | H01L 25/0652 |
| 2022/0059645 A1* | 2/2022 | Kang | H01L 23/5223 |

\* cited by examiner

*Primary Examiner* — Marcos D. Pizarro
*Assistant Examiner* — William Henry Anderson (57) ABSTRACT

A circuit module including an integrated circuit (IC) and a method for forming an IC are disclosed. An embodiment of the circuit module includes a trench having a conductive trench liner formed in a semiconductor substrate, and further includes semiconductor device circuitry formed in the substrate, where a conductor within a metallization layer of the semiconductor device circuitry electrically connects to the conductive trench liner. The embodiment also includes an insulating structure arranged over the conductive trench liner, where the insulating structure extends to an upper contact formed within an upper metallization layer of the semiconductor device circuitry. An isolation capacitor operable between the upper contact and the conductive trench liner has one or more electrical properties dependent on both a depth of the trench and a number of metallization layers below the upper metal layer in the semiconductor device circuitry.

20 Claims, 6 Drawing Sheets

INTEGRATED ISOLATOR INCORPORATING TRENCH CAPACITOR

BACKGROUND

This disclosure relates to integrated circuit design and fabrication, and in particular to formation of an integrated isolator.

Signal transmission between circuits without direct current flow between them is important to various applications. Isolators for this purpose can be based on multiple technologies, including conversion to and from optical signals, inductive coupling via transformers, and capacitive coupling. For isolation within or between integrated circuits, integration of an isolator into an integrated circuit reduces the number of components needed.

Integrated isolators using inductors or capacitors have been formed using integrated circuit (IC) metallization layers to implement inductor coils or capacitor plates. Like other dimensions of IC features, thicknesses of metallization layers and of the intermetal dielectric layers between them are subject to limitations imposed by design rules of the IC fabrication process used.

BRIEF DESCRIPTION OF THE DRAWINGS

It will be appreciated that for simplicity and clarity of illustration, elements illustrated in the figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION

An integrated isolator design disclosed herein employs a trench capacitor integrated on a semiconductor substrate with semiconductor device circuitry. In an embodiment, an isolation capacitor is formed with a bottom capacitor plate in the trench and a top plate formed within a metallization layer of the semiconductor device circuitry. The disclosed design is believed to provide greater configurability and lower fabrication cost than previous designs in which integrated isolation structures are formed solely within metallization layers of an integrated circuit.

Figure 1:
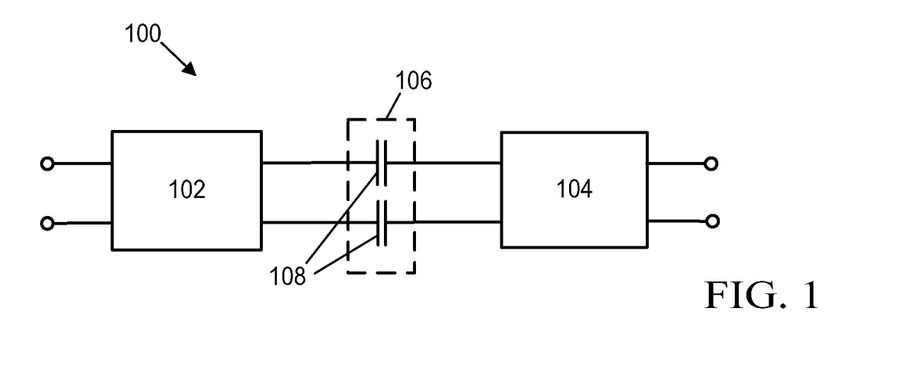
FIG. 1 is a schematic diagram illustrating a system employing an isolator between two circuits.

FIG. 1 is a schematic diagram illustrating the basic concept of a capacitive isolator. System 100 includes a first circuit 102 isolated from a second circuit 104 by isolator 106. Isolator 106 includes two capacitors 108 that prevent direct current flow between circuits 102 and 104, while allowing signals to be passed between the circuits. In an embodiment, circuit 102 is a transmitter circuit and circuit 104 a receiver circuit (or vice versa). Capacitive isolators may be implemented in circuits of other configurations in other embodiments.

Figure 2:
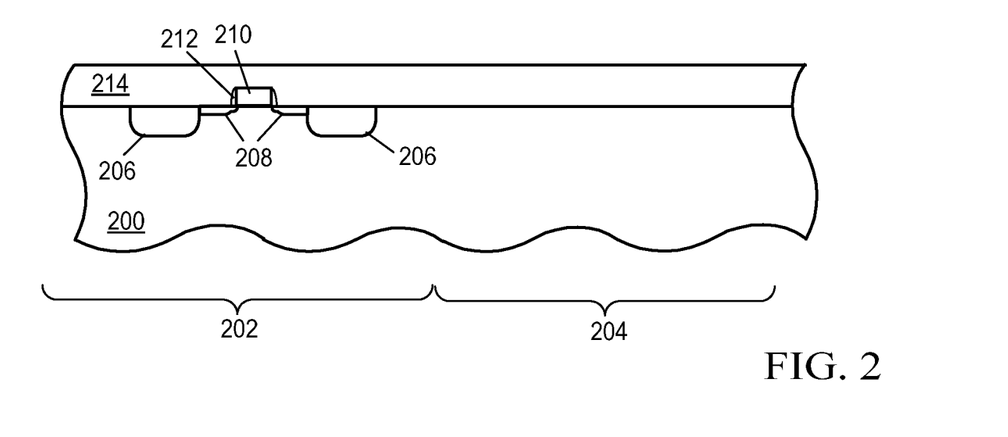
FIG. 2 is a partial cross-sectional view of a semiconductor substrate having a semiconductor device formed in a circuitry region according to one embodiment of the present invention.

FIGS. 2-7 illustrate successive configurations of a semiconductor substrate during an embodiment of a method for forming an integrated circuit including an integrated isolator. FIG. 2 is a partial cross-sectional view of a semiconductor substrate 200, of which a circuitry region 202 and an isolator region 204 are denoted by corresponding brackets. In the embodiment of FIG. 2, a field effect transistor (FET) structure including a gate region 210, sidewall spacers 212 and source/drain regions 208 is formed within circuitry region 202 of substrate 200. Isolation regions 206 are formed on either side of the FET structure, and interlevel dielectric 214 is deposited over substrate 200 and the devices formed therein. Interlevel dielectric 214 may sometimes be referred to as a premetal dielectric. In other embodiments, semiconductor devices of other types than the FET of FIG. 2 are formed within circuitry region 202. These devices may include, for example, other types of FET such as FinFET or laterally-diffused metal-oxide-semiconductor (LDMOS), or other transistor types such as bipolar transistors or heterojunction bipolar transistors.

The FET structure shown in FIG. 2 is merely one simplified example of semiconductor devices formed in circuitry region 202 of substrate 200 in embodiments of the methods disclosed herein. In an embodiment, devices formed in region 202 form a part of circuitry operable to implement a receiver or transmitter. Alternatively, devices formed in region 202 may form a part of circuitry operable to implement some other circuit function for which access to an isolator is desirable.

In an embodiment, devices formed in region 202 are formed using an established IC fabrication process. For example, substrate 200 is a silicon substrate in one embodiment. In a further embodiment, substrate 200 is a silicon layer of a semiconductor-on-insulator (SOI) substrate (See for example FIG. 11 where substrate 200 is layer of an SOI substrate). In other embodiments, substrate 200 is another type of semiconductor, such as a compound semiconductor and/or a semiconductor alloy. Example of compound semiconductors include, but are not limited to, GaAs, GaP, GaN, and InP. Semiconductor alloys include, but are not limited to, SiGe alloys, AlGaAsP alloys, AlGaN alloys and InGaP alloys. Isolation regions 206 are formed by shallow trench isolation (STI) in one embodiment, or may be formed by other methods such as localized oxidation of silicon (LOCOS) in other embodiments. Multiple process steps and variations thereof for semiconductor device formation will be understood by one of ordinary skill in the art of semiconductor fabrication in view of this disclosure, including but not limited to well implantation and annealing, gate patterning, dielectric spacer formation, source and drain implant and anneal, silicide formation, and interlevel dielectric deposition and chemical-mechanical polishing (CMP). In an embodiment, isolation regions 206, spacers 212 and interlevel dielectric 214 are each formed from $SiO_2$ layers deposited or grown using one of various deposition or growth process known to one of ordinary skill in the art. In other embodiments, one or more of regions 206, spacers 212 or layer 214 are formed from a different dielectric material such as silicon nitride. Devices within region 200 are formed using a complementary metal-oxide-semiconductor (CMOS) process in some embodiments.

The stage of processing depicted in FIG. 2 is sometimes referred to as completion of the "front end of the line" (FEOL), or fabrication of an integrated circuit up to, but not including, interconnect metal deposition. Embodiments of the integrated isolator fabrication processes disclosed herein allow FEOL processing to remain unchanged, aside from reservation of an isolator region of the substrate, such as region 204, in which other circuitry is not formed. In the embodiment of FIG. 2, devices formed in region 202 are sealed and protected by dielectric 214 prior to trench etching for isolator formation.

Figure 3:
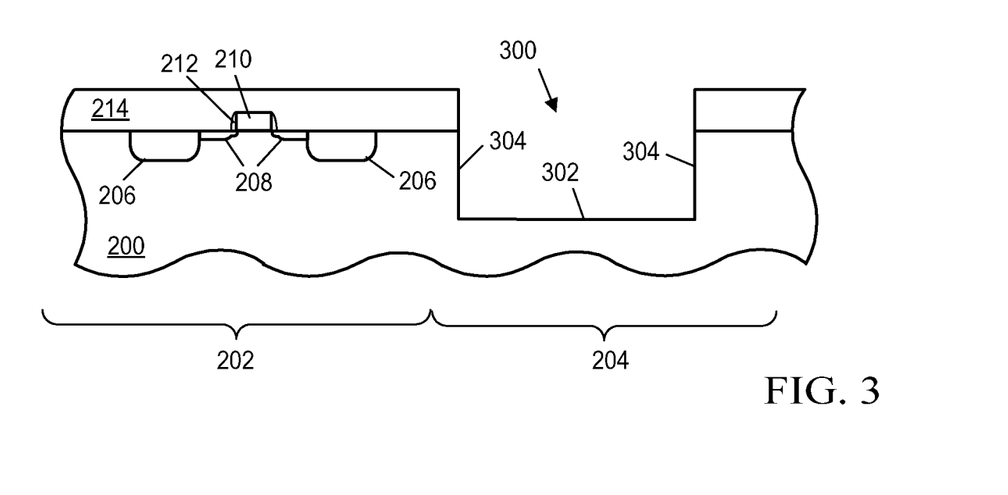
FIG. 3 is a partial cross-sectional view of the semiconductor substrate including a trench formed in an isolator region according to one embodiment of the present invention.

FIG. 3 is a partial cross-sectional view of substrate 200 after formation of a trench 300 in isolator region 204. In an embodiment, formation of trench 300 includes deposition of a silicon nitride layer by plasma-enhanced chemical vapor deposition (PECVD) for use as a hard mask, and patterning of the silicon nitride layer by photolithography and etching. In a further embodiment, the silicon nitride layer is approximately 0.1 Trench 300 is formed in such an embodiment by etching into substrate 200 using the patterned silicon nitride layer as a mask. In an embodiment, interlevel dielectric 214 is etched together with etching of an overlying silicon nitride hard mask. Etching of trench 300 is performed using an anisotropic etch process as understood by one of ordinary skill in the art. In an embodiment, a hard mask layer used to form trench 300 is subsequently removed. Trench 300 has a floor 302 and sidewalls 304.

Figure 4:
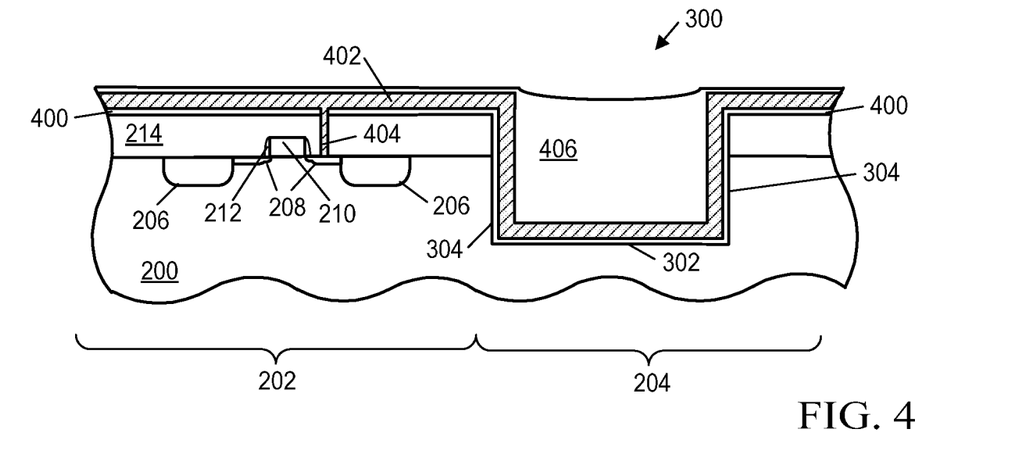
FIG. 4 is a partial cross-sectional view of the semiconductor substrate including a conductive layer deposited over the floor and sidewalls of the trench, and a trench fill dielectric deposited over the conductive layer according to one embodiment of the present invention.

FIG. 4 is a partial cross-sectional view of substrate 200 after a conductive layer 402 is deposited over the floor and sidewalls of trench 300. In the embodiment of FIG. 4, conductive layer 402 is formed during the process steps that form contact 404 through dielectric 214 to the FET structure in substrate 200. These steps are the contact layer portion of an established IC fabrication process used to fabricate circuitry in circuitry region 202. In an embodiment, the process includes deposition of nitride or oxide cap layer 400 over dielectric 214 and the exposed floor and sidewalls of trench 300. In addition to serving as an etch stop layer for subsequent contact metal deposition, layer 400 provides electrical isolation between conductive layer 402 in trench 300 and substrate 200. An opening is made through dielectric 214 so that deposition of conductive layer 402 produces contact 404. In an embodiment, deposition of conductive layer 402 comprises deposition of a contact barrier layer such as titanium, titanium nitride, tantalum nitride or a combination of these, followed by deposition of tungsten.

Fabrication of the structure shown in FIG. 4 further includes depositing a trench fill dielectric 406 to substantially fill trench 300. To the extent that an upper surface of dielectric 406 is below a top of trench 300 as defined by the top of conductive layer 402, the trench is nonetheless filled sufficiently that a subsequent dielectric layer deposition over dielectric 406 can fill in the rest of the trench and result in a continuous dielectric structure extending upward. In an embodiment, trench fill dielectric 406 is a material having high dielectric strength, such as silicon dioxide, silicon nitride, or a spin-on glass (SOG). In a further embodiment, trench fill dielectric is formed with SOG.

Figure 5:
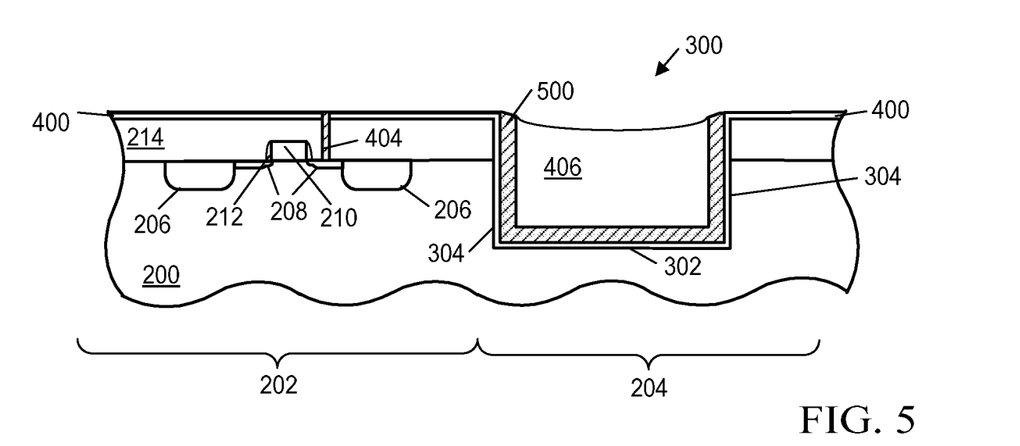
FIG. 5 is a partial cross-sectional view of the semiconductor substrate showing removal of portions of the conductive layer and trench fill layer outside of the trench according to one embodiment of the present invention.

FIG. 5 is a partial cross-sectional view of substrate 200 after portions of conductive layer 402 and trench fill dielectric 406 outside of the trench have been removed. In an embodiment, portions of conductive layer 402 external to trench 300 and contact 404 are removed using a tungsten CMP process employed in an established contact formation process for IC fabrication in region 202 of substrate 200. In a further embodiment, the tungsten CMP process is modified to first remove portions of trench fill dielectric 406 covering the portions of conductive layer 402 external to trench 300, or an additional step to remove these portions of dielectric 406 is added. Removal of the portions of conductive layer 402 external to the trench results in formation of a conductive trench liner 500 within trench 300.

Figure 6:
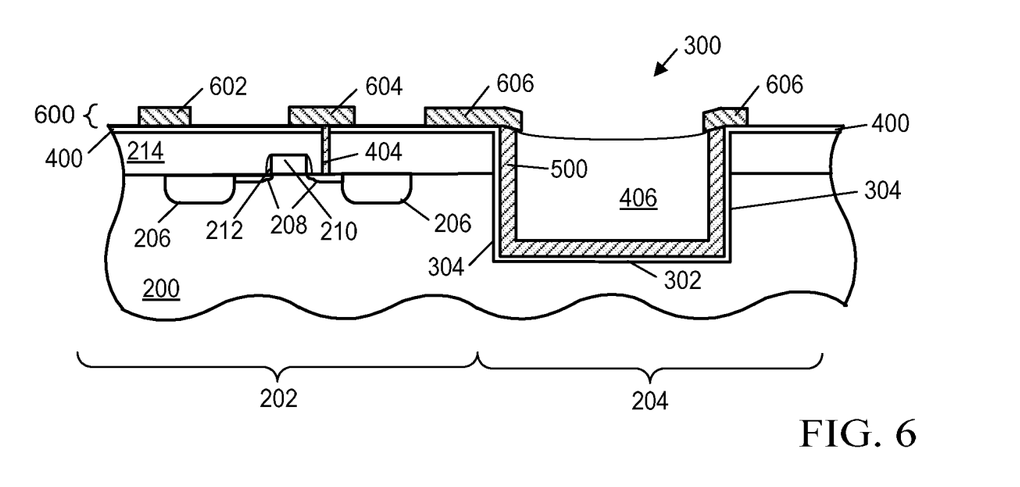
FIG. 6 is a partial cross-sectional view of the semiconductor substrate including a metallization layer according to one embodiment of the present invention.

FIG. 6 is a partial cross-sectional view of substrate 200 after formation of a metallization layer 600 over the interlevel dielectric. In an embodiment, the metallization layer is formed using metallization layer steps of an established IC fabrication process used in region 202 of substrate 200. As an example, such metallization layer steps can include metal layer deposition, metal masking and photolithography, metal etching to form interconnects or other conductors, photoresist stripping, and cleaning of the patterned conductors within metallization layer 600. In the embodiment of FIG. 6, the mask used for patterning of metallization layer 600 defines an interconnect 606 that electrically contacts trench liner 500 at the top of the sidewalls 304 of trench 300. Metallization layer 600 further includes other conductors, such as interconnect 604, which electrically connects to contact 404, and interconnect 602. In an embodiment, interconnects within metallization layer 600 are formed from copper.

Figure 7:
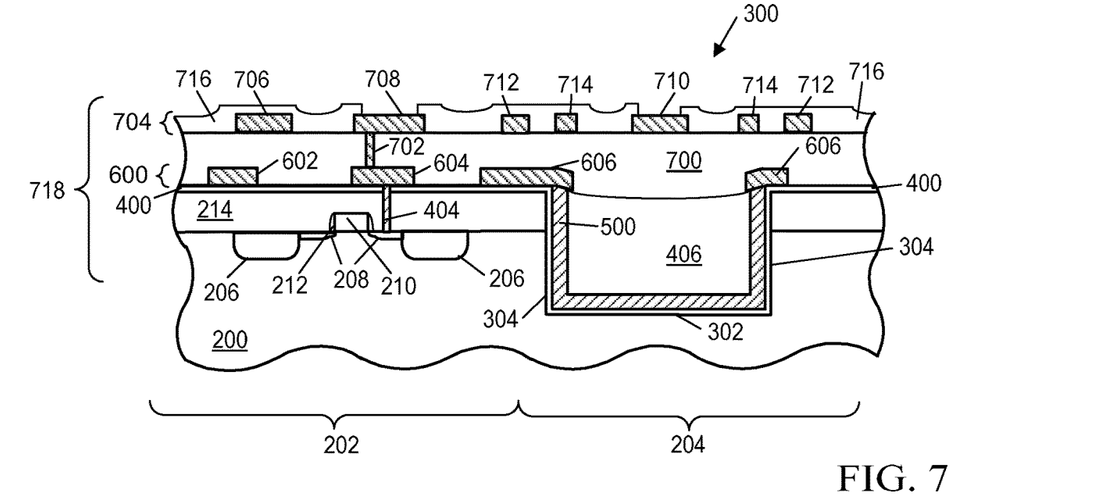
FIG. 7 is a partial cross-sectional view of the semiconductor substrate including an intermetal dielectric and uppermost metallization layer according to one embodiment of the present invention.

FIG. 7 is a partial cross-sectional view of substrate 200 after deposition of an intermetal dielectric 700 and formation of an uppermost metallization layer 704. In the embodiment of FIG. 7, a via 702 is formed through intermetal dielectric 700, forming a connection between an interconnect 708 in uppermost metallization layer 704 and interconnect 604 in metallization layer 604. A passivation layer 716 is formed over uppermost metallization layer 704. In an embodiment, intermetal dielectric 700, via 702, uppermost interconnect layer 704 and passivation layer 716 are formed using standard process modules of an established IC fabrication process employed for fabricating semiconductor circuitry 718 in region 202 of substrate 200. In a further embodiment, the standard process modules are part of a standard CMOS flow. Semiconductor circuitry 718 includes the semiconductor devices formed in region 202 as well as the overlying contacts and interconnects for accessing the devices. The steps illustrated by FIGS. 4-7 are often referred to as "back end of the line" (BEOL) processing, in which contacts and interconnects of an IC are formed. The trench formation in the embodiment of FIGS. 2-7 occurs between the FEOL and BEOL stages. In other embodiments, trench formation could be done before the FEOL device formation.

Figure 11:
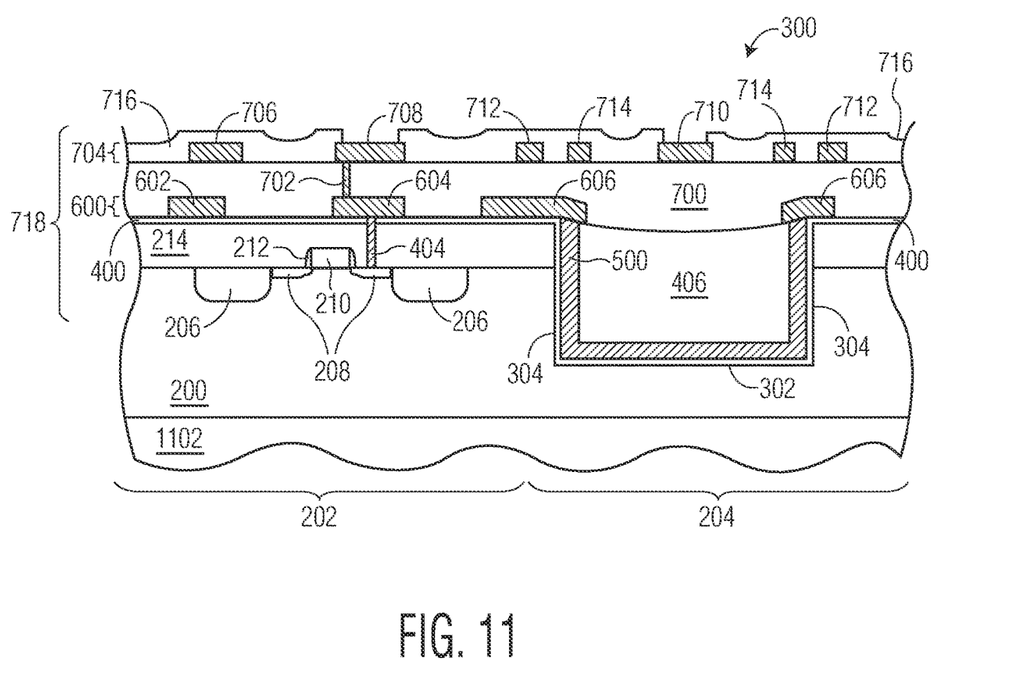
FIG. 11 is similar to FIG. 7 where the semiconductor substrate is a layer of a semiconductor-on-insulator (SOI) substrate according to one embodiment of the present invention.

In the embodiment of FIG. 7, the mask used for patterning of uppermost metallization layer 704 defines an upper contact 710 overlying a central portion of trench 300. Uppermost metallization layer 704 further includes guard ring structures 712 and 714 for blocking surface leakage currents. In an embodiment, ring 712 is a termination ring and ring 714 is a floating ring. In other embodiments, more or fewer guard ring structures are used. Other interconnects within uppermost metallization layer 704 include interconnect 708, which is electrically connected to interconnect 604 by via 702, and interconnect 706. In an embodiment, via 702 and interconnects within uppermost metallization layer 704 are formed from copper. In a further embodiment, intermetal dielectric 700 is a silicon dioxide layer and passivation layer 716 includes a silicon nitride or silicon oxynitride layer. Trench fill dielectric 406 and intermetal dielectric 700 combine to form a dielectric structure extending from trench liner 500 to upper contact 710. This creates an isolation capacitor operable between liner 500 and upper contact 710. Trench liner 500 forms a bottom plate of the capacitor, and is connected to circuitry 718 via interconnect 606 (the specific connection between interconnect 606 and a device within circuitry 718 is not shown in FIG. 7). Upper contact 710 forms a top plate of the capacitor, and can be connected to an additional circuit external to substrate 200. FIG. 11 is similar to FIG. 7 where substrate 200 is located over an insulating layer 1102 of an SOI substrate.

Figure 8:
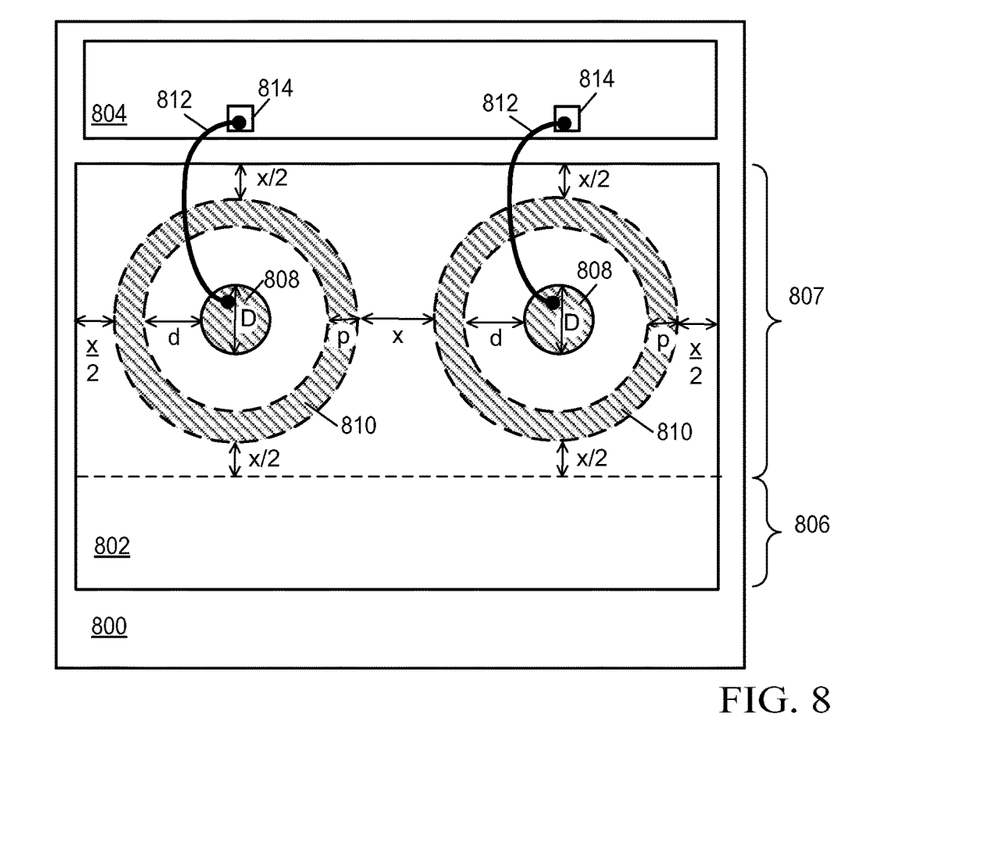
FIG. 8 is a top view of a circuit module using integrated capacitive isolators according to one embodiment of the present invention.

An example of connection of a top contact of an integrated capacitive isolator to an additional circuit is shown in FIG. 8. FIG. 8 is a simplified top view of a circuit module including a first integrated circuit 802 and second integrated circuit 804 mounted onto a chip carrier 800. Integrated circuit 802 is formed in and on a semiconductor substrate similar to substrate 200 of FIGS. 2-7, and includes a circuitry region 806 and isolator region 807, similar to regions 202 and 204, respectively, of FIGS. 2-7. Semiconductor device circuitry is formed in region 806 of IC 802 but not shown in the simplified view of FIG. 8. In an embodiment, IC 802 includes semiconductor device circuitry operable to implement a receiver circuit.

A pair of capacitive isolators is formed in isolator region 807 of IC 802. Each isolator includes an upper contact 808, similar to upper contact 710 in FIG. 7. Each isolator also includes a lower plate contact 810, similar to interconnect 606 of FIGS. 6-7. Lower plate contact 810 is shown with a dashed-line border to indicate that it is below the surface of IC 802, at a metallization layer similar to layer 600 in FIGS. 6-7. Guard rings such as rings 712 and 714 of FIG. 7 are not shown in the embodiment of FIG. 8 but may be present in other embodiments. Each of upper contacts 808 is connected via a respective wire bond 812 to a respective contact pad 814 on second IC 804. Contact pads 814 of IC 804 are electrically connected to semiconductor circuitry of IC 804, which circuitry is not shown in FIG. 8. In an embodiment, IC 804 includes semiconductor device circuitry operable to implement a transmitter circuit. In an embodiment in which IC 802 implements a receiver circuit and IC 804 implements a transmitter circuit, the pair of capacitors in region 807 of IC 802 functions as a communications channel isolator. However, such isolators may be used in other types of circuits as well.

Various lateral dimensions for the capacitive isolators of IC 802 are designated in FIG. 8, including an upper contact diameter D, a lower plate contact width p, a lateral spacing d between edges of upper contact 808 and lower plate contact 810, and a lateral spacing x between outer edges of the two lower plate contacts. These dimensions can be used to define dimensions of isolator region 807. In an embodiment in which a spacing of x/2 is maintained between outer edges of lower plate contact p and edges of region 807, a height H of region 807 can be defined as H=D+2d+2p+x, and a width W of region 807 can be defined as W=2D+4p+4d+2x.

With reference to the dimensions designated in FIG. 8, an example of some estimated dimensions and properties of an integrated isolation capacitor as disclosed herein is provided in Table 1 below. For the embodiment of Table 1, the capacitor dielectric is assumed to be $SiO_2$, with a dielectric constant of 3.9 and a dielectric strength of $10^7$ V/cm. The contact width p, spacing x and spacing d are each assumed to be 10 μm for the embodiment of Table 1. A dielectric layer thickness between capacitor plates of 6.5 μm is assumed. Using C=εA/d, where
C=capacitance in Farads,
ε=dielectric permittivity in Farads/meter,
A=area of capacitor plate overlap in square meters (which for this geometry is the upper plate area) and
d=distance between plates in meters,
and a vacuum permittivity of 8.854 pF/m gives the estimated dimensions in Table 1 for capacitors with 100 femtoFarad, 150 femtoFarad, and 200 femtoFarad capacitance values. It is noted that Table 1 reflects a simplified calculation and starting assumptions for rough estimation purposes rather than an optimized layout. Actual layout dimensions should account for multiple additional factors, such as prevention of breakdown in a lateral direction.

TABLE 1

| Estimated isolation capacitor lateral dimensions | | | |
|---|---|---|---|
| Total capacitance (fF) | 100 | 150 | 200 |
| Capacitor area (μm$^2$) | 1.882 × 10$^4$ | 2.824 × 10$^4$ | 3.765 × 10$^4$ |
| Upper contact diameter D (μm) | 155 | 190 | 219 |
| Isolator region height H (μm) | 205 | 240 | 269 |
| Isolator region width W (μm) | 410 | 479 | 538 |
| Isolator region area (mm$^2$) | 0.084 | 0.115 | 0.145 |
| Single capacitor area (mm$^2$) | 0.042 | 0.057 | 0.072 |

Figure 9:
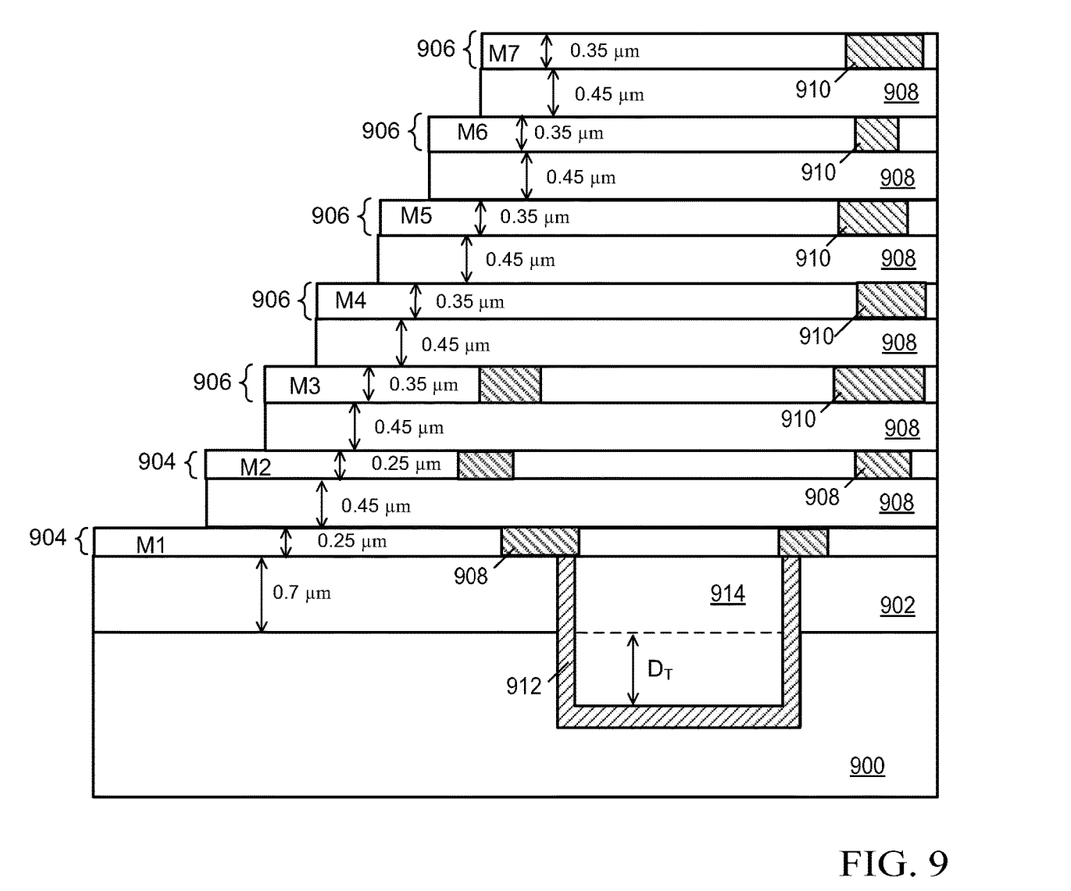
FIG. 9 is a cross-sectional view illustrating vertical dimensions producible by an embodiment of an integrated circuit fabrication process.

Turning now to consideration of vertical dimensions for capacitive isolators disclosed herein, FIG. 9 is a simplified cross-sectional view of a portion of a semiconductor substrate 900 having a conductive trench liner 912 and trench fill dielectric 914, showing seven metallization layers formed over the substrate. The structure of FIG. 9 is intended to illustrate vertical dimensions available using a given fabrication process, rather than to depict a specific IC configuration. In an embodiment, FIG. 9 illustrates the backend dimensions for a 0.13 μm process; other processes would have different dimensions than those in FIG. 9. A dashed line indicating the substrate surface prior to trench formation is used in defining a trench depth $D_T$ as the depth of the trench into the semiconductor substrate (as opposed to the depth extending through interlevel dielectric 902). In the embodiment of FIG. 9, interlevel dielectric 902 is 0.7 thick. Metallization layers labeled M1 through M7 are separated by intermetal dielectric layers 908 which are 0.45 μm thick. As is typical for integrated circuits having multiple metallization layers, metallization layer thicknesses in FIG. 9 are smaller for lower metallization layers (layers closer to the substrate) than for higher ones. In the embodiment of FIG. 9, 0.25 μm thick metallization layer 904 is used for the M1 and M2 metallization layers, while 0.35 μm thick metallization layer 906 is used for the M3 through M7 metallization layers.

Dielectric thicknesses available for isolation capacitors using an IC fabrication process corresponding to the structure of FIG. 9 can be determined by considering the vertical dimensions available and the capacitor structures used. In the case of a prior design in which capacitor plates are formed within respective metallization layers, the largest dielectric thickness available using the structure of FIG. 9 would be the dielectric thickness between M1 and M7, or 4.35 μm. One problem with such a structure is that some isolator applications require several kilovolts of isolation and may therefore require capacitor dielectric thicknesses of 5 μm or more. Another problem is that additional metallization layers add significant costs to a fabrication process, so that using a process with more metallization layers than are needed for the non-isolator circuitry can be quite expensive.

The isolator employing a trench capacitor disclosed herein reduces the number of metal layers needed to obtain a given capacitor dielectric thickness, since a portion of the capacitor dielectric is formed within the trench. For example, the 6.5 μm dielectric thickness assumed in the calculation of Table 1 could be obtained using only two metallization layers of the structure of FIG. 9. A dielectric thickness between the bottom of trench liner 912 and an upper contact formed in the M2 layer would be 6.5 μm if trench depth $D_T$ is 5.1 μm. Because formation of such a deep trench can cause its own processing problems, it may be more desirable in some embodiments to use a greater number of metallization layers so that a shallower trench can be used. Continuing with the example of a 6.5 μm dielectric thickness using the process of FIG. 9, forming the upper contact in the M3 layer would allow for a trench depth $D_T$ of 4.4 μm, and forming the upper contact in the M4 layer would allow for a depth of 3.6 μm. Whatever number of metallization layers is used, metallization layers below the uppermost metallization layer are patterned such that no interconnects from these intervening metallization layers overlie the trench.

Figure 10:
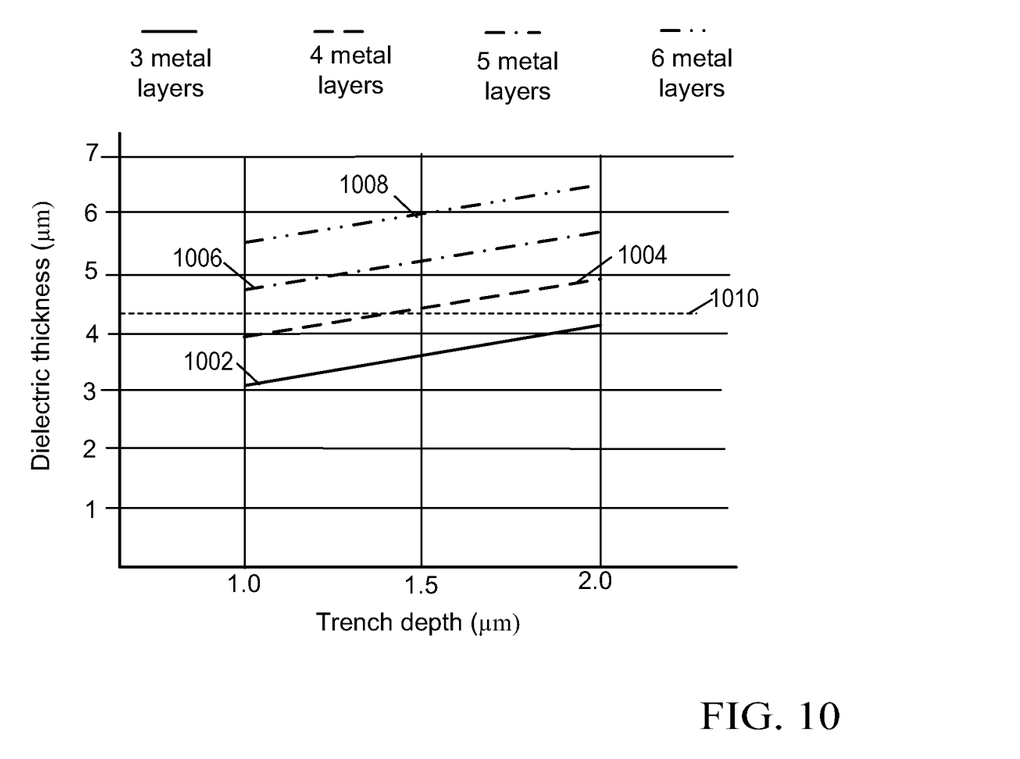
FIG. 10 is a graph illustrating possible capacitor dielectric thicknesses for a range of trench depths and number of metallization layer numbers utilized by an embodiment of an integrated circuit fabrication process, according to one embodiment of the present invention.

The integrated isolator structure disclosed herein has a capacitor dielectric formed from a combination of trench depth and metallization layer spacing. As such, electrical properties of the isolation capacitor, such as capacitance or breakdown voltage, depend on both the depth of the trench and the number of metallization layers in the IC. The structure disclosed herein allows greater dielectric thicknesses to be achieved with fewer metallization layers needed in the IC as compared to previous solutions. The number of metallization layers used can be increased in order to reduce the trench depth required to obtain a desired dielectric thickness, or the trench depth can be increased to reduce the number of metallization layers required. In an embodiment, a discrete set of available trench depths is included in the design rules of an IC fabrication process. In such an embodiment, circuit designers can choose among the available trench depths and choose a desired number of metallization layers when designing an integrated isolator. FIG. 10 is a graph of isolator dielectric thickness as a function of trench depth for a process producing the vertical dimensions shown in FIG. 9. The four traces in FIG. 10 are for isolation capacitors formed using 3, 4, 5 and 6 metallization layers, respectively. If the available trench depths in a process corresponding to FIG. 10 were 1 μm, 1.5 μm and 2 μm, a set of dielectric thicknesses in a range from 3.1 μm to 6.5 μm would be achievable, depending on how many metallization layers were used. Graphs similar to FIG. 10 can be produced for fabrication processes other than that of FIG. 9, with dielectric thickness corresponding to the vertical dimensions achievable by those processes.

Multiple alternatives and variations to the semiconductor processes described herein will be apparent to one of ordinary skill in the art of integrated circuit design and manufacturing in view of this disclosure. Aspects of IC fabrication processes described herein, such as dimensions, specific materials and circuit technologies, are merely examples. The vertical dimensions shown in FIG. 9, for example, are suitable for the back end of an 0.13 μm process. Other processes have different vertical dimensions. Although a circular geometry is shown in FIG. 8 for lower plate contact 810 and upper contact 808, the isolation capacitor disclosed herein could have a noncircular shape in other embodiments, such as rectangular, square, oval, or any other shape. Wire bond connections described herein could be made with some other electrical coupling technology, such as solder bumps in a tape-automated bonding or flip-chip packaging arrangement.

An embodiment disclosed herein of a circuit module including an integrated circuit includes a first trench formed in a semiconductor substrate, a first conductive trench liner covering a floor and sidewalls of the first trench, semiconductor device circuitry formed in the semiconductor substrate, and an insulating structure arranged over the first conductive trench liner and filling the first trench. A first conductor within a metallization layer of the semiconductor device circuitry electrically connects to the first conductive trench liner, the insulating structure extends to a first upper contact formed within an upper metallization layer of the semiconductor device circuitry and overlying a central portion of the first trench, and a first isolation capacitor operable between the first upper contact and the first conductive trench liner has one or more electrical properties dependent on both a depth of the first trench and a number of metallization layers below the upper metallization layer in the semiconductor device circuitry.

In a further embodiment of the circuit module, the semiconductor substrate is an upper layer of a semiconductor on insulator substrate. Another embodiment of the circuit module also includes an insulating layer between the first conductive trench liner and the floor and sidewalls of the first trench. In still another embodiment of the circuit module, the upper metallization layer is connected by one or more vias to the metallization layer. In an alternative embodiment, the circuit module further includes one or more additional metallization layers of the semiconductor device circuitry between the metallization layer and the upper metallization layer. In another embodiment the circuit module further comprises an electrical coupling of the first upper contact to a contact of a separate integrated circuit. In still another embodiment, the upper metallization layer includes an uppermost metallization layer of the semiconductor device circuitry.

In another embodiment of the circuit module, the semiconductor device circuitry is operable to implement a receiver or transmitter circuit. In a further embodiment, the circuit module further includes a second trench formed in the semiconductor substrate and a second conductive trench liner covering a floor and sidewalls of the second trench. A second conductor within the metallization layer of the semiconductor device circuitry electrically connects to the second conductive trench liner, the insulating structure is further arranged over the second conductive trench liner and filling the second trench, the insulating structure further extends to a second upper contact formed within the upper metallization layer of the semiconductor device circuitry and overlying a central portion of the second trench, and a second isolation capacitor operable between the second upper contact and the second conductive trench liner has one or more electrical properties dependent on both a depth of the second trench and the number of metallization layers below the upper metallization layer in the semiconductor device circuitry.

An embodiment of a method disclosed herein includes forming one or more semiconductor devices in a circuitry region of a semiconductor substrate, depositing an interlevel dielectric over the semiconductor substrate containing the one or more semiconductor devices, and forming, in an isolator region of the semiconductor substrate, a first trench into the semiconductor substrate. The embodiment further includes forming a first conductive trench liner covering a floor and sidewalls of the first trench, depositing a trench fill dielectric over the first conductive trench liner and substantially filling the first trench, and forming a metallization layer over the first interlevel dielectric. A first conductor within the metallization layer electrically connects to the first conductive trench liner, and the metallization layer includes an interconnect for the one or more semiconductor devices. The embodiment further includes depositing a first intermetal dielectric over the substrate containing the first trench and the metallization layer and forming an upper metallization layer above the first intermetal dielectric layer, where the upper metallization layer comprises a first upper contact overlying a central portion of the first trench.

In a further embodiment of the method, forming the upper metallization layer above the first intermetal dielectric layer includes forming one or more additional metallization layers, covered by one or more respective additional intermetal dielectric layers, between the first intermetal dielectric layer and the upper metallization layer.

In another embodiment of the method, forming the one or more semiconductor devices includes forming components of circuitry operable as a receiver or transmitter circuit. A further embodiment also includes forming, in the isolator region of the semiconductor substrate, a second trench into the semiconductor substrate, forming a second conductive trench liner covering a floor and sidewalls of the second trench, and depositing the trench fill dielectric over the second conductive trench liner and substantially filling the second trench. A second conductor within the metallization layer electrically connects to the second conductive trench liner, depositing the first intermetal dielectric layer includes depositing the first intermetal dielectric layer over the substrate containing the first trench, second trench and metallization layer, and the upper metallization layer further includes a second upper contact overlying a central portion of the second trench.

An embodiment disclosed herein of a circuit module including an integrated circuit includes a first trench formed in a first semiconductor substrate, a first conductive trench liner covering a floor and sidewalls of the first trench, first semiconductor device circuitry formed in the first semiconductor substrate and an insulating structure arranged over the first conductive trench liner and filling the first trench. A first conductor within a metallization layer of the first semiconductor device circuitry electrically connects to the first conductive trench liner, and the insulating structure extends to a first upper contact formed within an upper metallization layer of the first semiconductor device circuitry and overlying a central portion of the first trench. The embodiment further includes a second integrated circuit comprising second semiconductor device circuitry formed in a second semiconductor substrate and an electrical coupling between the first upper contact and a first contact pad of the second integrated circuit. In a further embodiment, the electrical coupling includes a wire bond connection.

In a further embodiment of the circuit module, one of the first semiconductor circuitry and second semiconductor circuitry is operable to implement a receiver circuit, and the other of the first semiconductor circuitry and second semiconductor circuitry is operable to implement a transmitter circuit. A still further embodiment of the circuit module further includes a second trench formed in the first semiconductor substrate, a second conductive trench liner covering a floor and sidewalls of the second trench, and an electrical coupling between the second upper contact and a second contact pad of the second integrated circuit. The insulating structure is further arranged over the second conductive trench liner and filling the second trench, and the insulating structure further extends to a second upper contact formed within the upper metallization layer of the first semiconductor device circuitry and overlying a portion of the second trench.

In another embodiment of the circuit module, one or both of the first semiconductor substrate or second semiconductor substrate is an upper layer of a semiconductor on insulator substrate. In still another embodiment, the upper metallization layer of the first semiconductor device circuitry is connected by one or more vias to the metallization layer. An alternative embodiment further includes one or more additional metallization layers of the first semiconductor device circuitry between the metallization layer and the upper metallization layer.

Although the present disclosure includes several embodiments, the invention is not intended to be limited to the specific forms set forth herein. On the contrary, it is intended to cover such alternatives, modifications, and equivalents as can be reasonably included within the scope of the invention as defined by the appended claims and equivalents thereof.

What is claimed is:

1. A circuit module including an integrated circuit, comprising:
   a first trench formed in a semiconductor substrate;
   a first conductive trench liner covering a floor and sidewalls of the first trench;
   semiconductor device circuitry formed in the semiconductor substrate, wherein a first conductor within a metallization layer of the semiconductor device circuitry electrically connects to the first conductive trench liner; and
   an insulating structure arranged over the first conductive trench liner and filling the first trench, wherein
      the insulating structure extends to a first upper contact formed within an upper metallization layer of the semiconductor device circuitry and overlying a central portion of the first trench, and
      a first isolation capacitor operable between the first upper contact and the first conductive trench liner has one or more electrical properties dependent on both a depth of the first trench and a number of metallization layers below the upper metallization layer in the semiconductor device circuitry.

2. The circuit module of claim 1, wherein the semiconductor substrate is an upper layer of a semiconductor on insulator substrate.

3. The circuit module of claim 1, wherein the upper metallization layer is connected by one or more vias to the metallization layer.

4. The circuit module of claim 1, further comprising one or more additional metallization layers of the semiconductor device circuitry between the metallization layer and the upper metallization layer.

5. The circuit module of claim 1, wherein the semiconductor device circuitry is operable to implement a receiver or transmitter circuit.

6. The circuit module of claim 5, further comprising:
a second trench formed in the semiconductor substrate; and
a second conductive trench liner covering a floor and sidewalls of the second trench, wherein
a second conductor within the metallization layer of the semiconductor device circuitry electrically connects to the second conductive trench liner,
the insulating structure is further arranged over the second conductive trench liner and filling the second trench,
the insulating structure further extends to a second upper contact formed within the upper metallization layer of the semiconductor device circuitry and overlying a central portion of the second trench, and
a second isolation capacitor operable between the second upper contact and the second conductive trench liner has one or more electrical properties dependent on both a depth of the second trench and the number of metallization layers below the upper metallization layer in the semiconductor device circuitry.

7. The circuit module of claim 1, further comprising an electrical coupling between the first upper contact and a contact of a separate integrated circuit.

8. The circuit module of claim 1, further comprising an insulating layer between the first conductive trench liner and the floor and sidewalls of the first trench.

9. The circuit module of claim 1, wherein the upper metallization layer comprises an uppermost metallization layer of the semiconductor device circuitry.

10. A method of forming an integrated circuit, the method comprising:
forming one or more semiconductor devices in a circuitry region of a semiconductor substrate;
depositing an interlevel dielectric over the semiconductor substrate containing the one or more semiconductor devices;
in an isolator region of the semiconductor substrate, forming a first trench into the semiconductor substrate;
forming a first conductive trench liner covering a floor and sidewalls of the first trench;
depositing a trench fill dielectric over the first conductive trench liner and substantially filling the first trench;
forming a metallization layer over the interlevel dielectric, wherein
a first conductor within the metallization layer electrically connects to the first conductive trench liner, and
the metallization layer includes an interconnect for the one or more semiconductor devices;
depositing a first intermetal dielectric layer over the semiconductor substrate containing the first trench and the metallization layer; and
forming an upper metallization layer above the first intermetal dielectric layer, wherein the upper metallization layer comprises
a first upper contact overlying a central portion of the first trench.

11. The method of claim 10, wherein forming the upper metallization layer above the first intermetal dielectric layer comprises forming one or more additional metallization layers, each covered by one or more respective additional intermetal dielectric layers, between the first intermetal dielectric layer and the upper metallization layer.

12. The method of claim 10, wherein forming the one or more semiconductor devices comprises forming components of circuitry operable as a receiver or transmitter circuit.

13. The method of claim 12, further comprising:
forming, in the isolator region of the semiconductor substrate, a second trench into the semiconductor substrate;
forming a second conductive trench liner covering a floor and sidewalls of the second trench; and
depositing the trench fill dielectric over the second conductive trench liner and substantially filling the second trench, wherein
a second conductor within the metallization layer electrically connects to the second conductive trench liner,
depositing the first intermetal dielectric layer comprises depositing the first intermetal dielectric layer over the semiconductor substrate containing the first trench, second trench and metallization layer, and
the upper metallization layer further comprises a second upper contact overlying a central portion of the second trench.

14. A circuit module including an integrated circuit, comprising:
a first trench formed in a first semiconductor substrate;
a first conductive trench liner covering a floor and sidewalls of the first trench;
first semiconductor device circuitry formed in the first semiconductor substrate, wherein a first conductor within a metallization layer of the first semiconductor device circuitry electrically connects to the first conductive trench liner;
an insulating structure arranged over the first conductive trench liner and filling the first trench, wherein the insulating structure extends to a first upper contact formed within an upper metallization layer of the first semiconductor device circuitry and overlying a central portion of the first trench;
a second integrated circuit comprising second semiconductor device circuitry formed in a second semiconductor substrate; and
an electrical coupling between the first upper contact and a first contact pad of the second integrated circuit.

15. The circuit module of claim 14, wherein one of the first semiconductor circuitry and second semiconductor circuitry is operable to implement a receiver circuit, and the other of the first semiconductor circuitry and second semiconductor circuitry is operable to implement a transmitter circuit.

16. The circuit module of claim 15, further comprising:
a second trench formed in the first semiconductor substrate;
a second conductive trench liner covering a floor and sidewalls of the second trench; and
an electrical coupling between a second upper contact and a second contact pad of the second integrated circuit, wherein
the insulating structure is further arranged over the second conductive trench liner and filling the second trench, and the insulating structure further extends to the second upper contact formed within the upper metallization layer of the first semiconductor device circuitry and overlying a central portion of the second trench.

17. The circuit module of claim 14, wherein the upper metallization layer of the first semiconductor device circuitry is connected by one or more vias to the metallization layer.

18. The circuit module of claim 14, further comprising one or more additional metallization layers of the first semiconductor device circuitry between the metallization layer and the upper metallization layer.

19. The circuit module of claim 14, wherein one or both of the first semiconductor substrate or second semiconductor substrate is an upper layer of a semiconductor on insulator substrate.

20. The circuit module of claim 14, wherein the electrical coupling comprises a wire bond connection.

* * * * *